Figure 1:
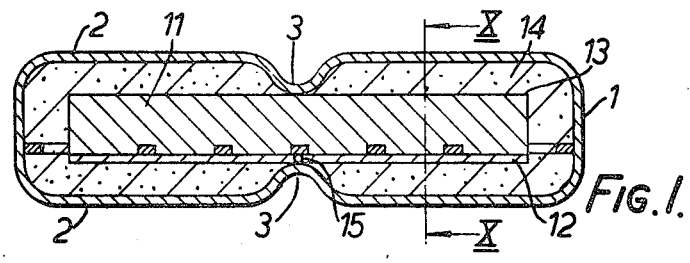

United States Patent [19]
Archer

[11] Patent Number: 4,480,148
[45] Date of Patent: Oct. 30, 1984

[54] ELECTRICAL DEVICE PACKAGE
[75] Inventor: Steven K. Archer, Wiltshire, England
[73] Assignee: Plessey Overseas Limited, Ilford, England
[21] Appl. No.: 377,059
[22] Filed: May 11, 1982
[30] Foreign Application Priority Data
May 13, 1981 [GB] United Kingdom ............... 8114541
[51] Int. Cl.³ ............................................. H05K 5/04
[52] U.S. Cl. ............................. 174/51; 174/52 PE; 174/52 FP; 310/313 R; 310/313 C
[58] Field of Search ............... 174/52 PE, 52 FP, 51; 310/313 R, 313 A, 313 B, 313 C, 313 D

[56] References Cited
U.S. PATENT DOCUMENTS 3,469,148  9/1969  Lund ............................. 174/52 PE
3,469,684  9/1969  Keady det al. ............. 174/52 FP X
3,484,536  12/1969  Jaeschke et al. ............. 174/52 PE
4,105,861  8/1978  Hascoe ........................... 174/52 FP
4,291,285  9/1981  Kadota ....................... 310/313 R X
4,296,347  10/1981  Weirauch ....................... 310/313 B Primary Examiner—John Gonzales
Assistant Examiner—D. A. Tone
Attorney, Agent, or Firm—Fleit, Jacobson, Cohn & Price

[57] ABSTRACT

An electrical device package comprising an open ended container and an enclosure defining a cavity in which an electrical device is contained. The enclosure is positioned in the container and is sealed therein by a filling of moulding material.

The package is particularly suitable for containing surface acoustic wave devices e.g. filters where contact with the moulding material during and after packaging must be avoided.

19 Claims, 6 Drawing Figures

ELECTRICAL DEVICE PACKAGE

This invention relates to an electrical device package having a sealed cavity in which the electrical device is contained and more particularly but not exclusively to a package in which the electrical device comprises a surface acoustic wave device.

A known device package which has been used for both surface acoustic wave devices and semiconductor chips is the plastics flat pack. This flat pack is a moulded device and whilst inexpensive to produce, is not satisfactory hermetically, particularly for use for surface acoustic wave devices. Due to the necessary use of a mould release agent a satisfactory hermetic seal can not be achieved between the plastics material and the device leads.

Another known package utilises a box into which the electronic device is inserted. A plug piece is moulded onto the leads of the device and the combination plugged into the box which is sealed to the plug piece by means of a flow of epoxy material. A problem with this construction is differential thermal expansion between the various parts and degredation by moisture causing a breakdown in seals.

A package which is very satisfactory hermetically is the TO8 can construction. The device is mounted onto a metal header and leads to the device pass through the header and are sealed by means of glass-to-metal seals. A metal cap is finally welded onto the header.

The TO8 package, unfortunately, is very expensive and may cost more than the device chip.

This invention seeks to provide an electrical device package in which the above mentioned problems of cost and unsatisfactory hermetic properties are mitigated.

According to the invention there is provided, an electrical device package comprising an open ended container and an enclosure defining a cavity, which enclosure is formed by a housing which is open on one side and has a closure therefore, an electrical device mounted on a substrate positioned within the cavity and sealed therein by the closure, which enclosure is positioned in the container and is sealed therein by a filling of moulding material.

The electronic device may be a surface acoustic wave device.

The means supporting the device may be a lead frame which provides electrical leads extending from the open end of the container to provide external electrical connections to the device.

The enclosure may be formed by a housing which is open on one side and has a closure therefore.

The closure may be formed from plastics material and in one embodiment of the invention is a length of polyester tape.

The housing may be formed from plastics material, which may be polyester.

The container may be provided with means to constrict an internal dimension to provide locating means for the enclosure.

The means to constrict an internal dimension of the container may be formed by an indentation in each wall of an opposing pair of walls of the container.

In one embodiment of the invention the container is formed from plastics material which may be polyester and in another embodiment the container is formed from metal which may be aluminium.

In the case of a metal container the indentations are preferably oppositely disposed and extend for substantially the full depth of the container walls to divide the container into two parts one containing the input circuitry and the other containing output circuitry of the electrical device to electrically screen the input and output circuitry one from another when the container is earthed. The container may be electrically connected to an electrical lead extending from the open end of the container for earthing the container.

The moulding material may be epoxy and is preferably a casting grade epoxy material.

Figure 2:
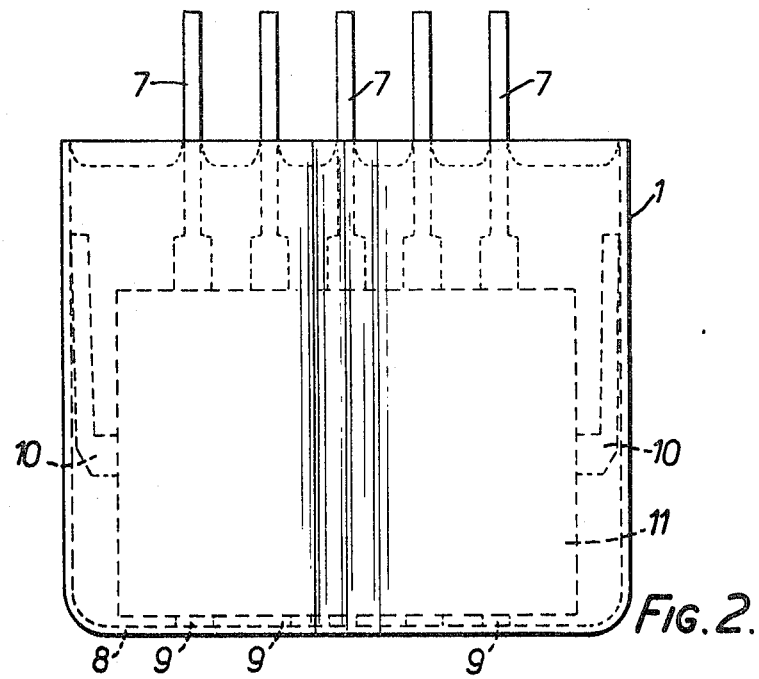
Figure 3:
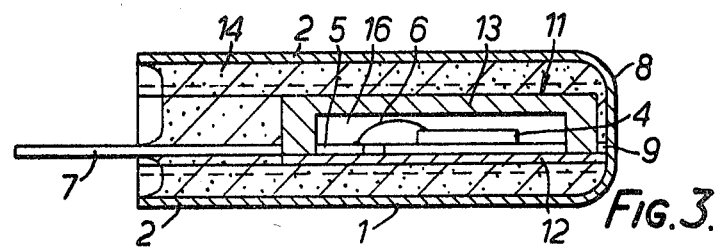
Figure 4:
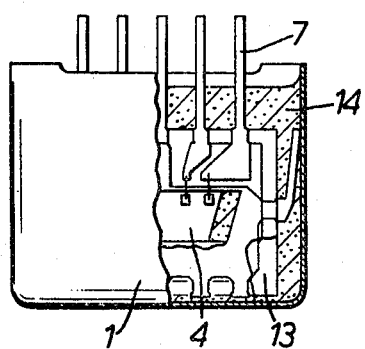
Figure 5:
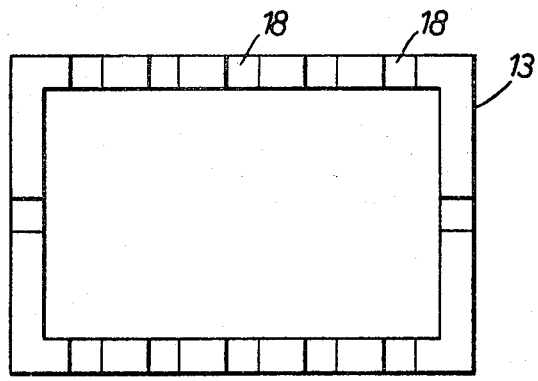
Figure 6:
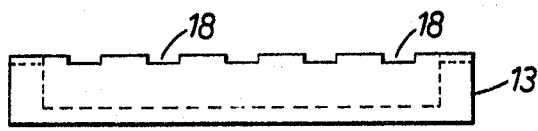

An embodiment of the invention will now be described, by way of example only, with reference to the drawings in which:

FIG. 1 is an end elevational view of an electrical device package constructed in accordance with the invention FIG. 2 is a plan view of the device package of FIG. 1, FIG. 3 is a cross sectional side elevation taken along the lines X—X of FIG. 1, FIG. 4 is a part sectional plan view of the device of FIGS. 1 to 3, FIG. 5 is a plan view of a housing forming part of the package of FIGS. 1 to 4, and FIG. 6 is a side view of the housing of FIG. 5.

Referring to FIGS. 1 to 4 of the drawings the illustrated device package comprises an open-ended aluminium container 1 having major walls 2 each provided with an indentation 3 extending down the wall for substantially its entire depth. The indentations 3 in the opposing major walls 2 are located opposite one another so as to constrict the internal dimension of the container 1 between the walls 2 at one position.

An electrical device in the form of a surface acoustic wave device 4 is supported within the container by means of a lead frame 5 and is connected to the lead frame 5 by means of connecting wires 6. The lead frame 5 provides five electrical leads 7 which extend through the open end of the container 1 so as to provide external electrical connection to the surface acoustic wave device 4.

The position of the device 4 within the container 1 is accurately determined by means of the lead frame end feet 9 each of which extends to sit on an internal base 8 of the container, sideways movement of the frame being prevented by means of side arms 10. Alternatively, the feet may be dispensed with and the device can be located against the bottom of the container.

To protect the surface acoustic wave device 4 during sealing of the container, the device is located in the container 1 within an enclosure 11. The enclosure 11 is formed by plastics housing 13 shown in greater detail in FIGS. 5 and 6. The housing 13 is a shallow rectangular receptacle the upper edge of the side walls of which are provided with shallow slots 18 of depth substantially equal to the thickness of leads of the lead frame. During assembly, a lead frame 5, provided with the surface acoustic wave device 4 mounted on a paddle of the frame and wired to the leads 7 of the lead frame, is located in the housing 13 with the device 4 extending inwardly of the housing and with the leads 7 of the lead frame extending each through a different one of the slots 18. The housing is sealed by means of a closure formed by a strip 12 of plastics material which extends over the open side of the housing, is secured to the upper edge of the side walls and to the leads of the lead frame in any suitable manner and together with the housing forms a sealed cavity in which the electrical device is contained. The strip may be a thermoplastics material. It may be self adhesive tape, or may be sealed with a separate adhesive or may be sealed by thermal or ultrasonic means. In a particularly advantageous form the sealing is effected by means of a strip having on one face a layer of thermo plastics material which melts at a lower temperature than the rest of the strip and which forms an adhesive upon application of a heating effect. With this strip sealing is effected by applying the dry strip to the open sided container and applying a heating effect at the interface by conduction or ultrasonic means.

The enclosure 11 is secured to the lead frame in such a position and is of such a size as to be prevented from contacting the interior base of the container 1 by means of the lead frame feet 9 which sit on the internal base 8 of the container 1. The side arms 10 of the lead frame 5 prevent sideways movement of the enclosure 11 and ensure a space between the enclosure and the side walls of the container 1.

The enclosure 11 is however contacted and located by the indentations 3 in the major walls 2 of the container 1 this being essentially a tangential line contact, remaining portions of the housing 13 and closure 12 of the enclosure 11 being spaced from the major walls 2 of the container.

In essence therefore the enclosure 11 is substantially completely spaced from all internal walls of the container 1 and the device 4 is hermetically sealed by means of a filling 14, typically of casting grade epoxy resin. The enclosure 11 acts to protect the device 4 during filling and to provide a cavity 16 within the container in which the surface acoustic wave device is contained.

The filling 14 forms a seal to interior walls of the container 1, extends around the enclosure 11, encapsulating the device 4, and forms a seal around the leads 7 of the lead frame 5. Since a release agent is not required, a good hermetic seal can be achieved between the filling 14 and the leads 7.

If for any reason there is partial failure of the package between the filling 14 and the walls of the container 1 the device 4 remains hermetically sealed since the filling 14 itself extends around the enclosure 11 within which the device 4 is located.

The metal container 1 is preferably earthed in use to protect the device from stray radiation. When earthed the indentations 3 in the container separate the package into two parts and by providing input and output connections in opposite parts of the housing a degree of electrical isolation is provided for avoidance of direct break through of signals therebetween.

In order to provide positive earthing of the container spot welding of a container indentation 3 to the adjacent central lead 7 of the lead frame is effected. The spot weld is shown as 15 in FIG. 1.

The invention has been described by way of example only and modifications may be made without departing from the scope of the invention. In particular although in the embodiment described the container 1 is formed from aluminium, a plastics material, typically polyester may be utilized for this container. Also whilst the container illustrated has indentations 3 in the major walls 2, these are not essential and the major walls 2 of the container may be provided without indentations. In this latter case contact between the major walls 2 and the enclosure is prevented by means of locating grooves or pips within the container which engage the side arms 10 of the lead frame.

The described package has 5 pins but it will be appreciated that there could be provided any suitable number of pins, e.g. 10 pins. In addition although the embodiment described employs pins disposed in a single in-line configuration, multi-line configurations of pins could be employed e.g. dual in line. Although the container described is open at a narrow end it will be appreciated that the open end could be on a wide side of the container illustrated or packages of different shape, e.g. round could be employed. Such configurations are intended to fall within the scope of this invention.

The invention is particularly applicable to the manufacture of surface acoustic wave devices which must be protected from contact with moulding material during and after packaging and in the present invention this is ensured by means of the enclosure 11 which defines a cavity in which the device is contained. Nevertheless the invention is equally well applicable to the packaging of semiconductor or other electronic devices.

What I claim is:

1. An electrical device package, comprising an open ended container and an enclosure defining a cavity, which enclosure is formed by a housing that is open on one side and has a closure therefore, an electrical device mounted on a substrate positioned within the cavity and sealed therein by the closure, which enclosure is positioned in the container and is sealed therein by a filling of moulding material wherein the substrate is a lead frame providing electrical leads extending from the open end of the container to provide external electrical connections to the device.

2. An electrical device package as claimed in claim 1 in which the device is a surface acoustic wave device.

3. An electrical device package as claimed in claim 1 in which the closure is formed from plastic material.

4. An electrical device package as claimed in claim 3 in which the closure is provided by a strip of thermoplastic material.

5. An electrical device package as claimed in claim 4 in which the strip of thermoplastics material is a polyester tape.

6. An electrical device package as claimed in claim 4, wherein the strip has a self adhesive coating.

7. An electrical device package as claimed in claim 4, wherein the strip has on one face a layer of thermoplastics material which melts at a lower temperature than the rest of the strip and adhesion between strip and housing is effected as a result of heating at the interface therebetween.

8. An electrical device package as claimed in claim 1 in which the housing is formed from plastics material.

9. An electrical device package as claimed in claim 8 in which the closure is formed from polyester material.

10. An electrical device package as claimed in claim 1 in which the container is provided with means to constrict an internal dimension to provide locating means for the enclosure.

11. An electrical device package as claimed in claim 10 in which the means to constrict an internal dimension of the container is formed by an indentation in each wall of an opposing pair of walls of the container.

12. An electrical device package as claimed in claim 11, in which the container is formed from metal, the indentations are oppositely disposed and extend for substantially the full depth of the container walls to divide the container into two parts, one containing input circuits and the other containing output circuits of the electrical device to electrically screen the input and output circuits one from another when the container is electrically grounded.

13. An electrical device package as claimed in claim 12, in which the container is electrically connected to an electrical lead extending from the open end of the container for electrically grounding the container.

14. An electrical device package as claimed in claim 1 in which the container is formed from plastics material.

15. An electrical device package as claimed in claim 14 in which the plastics material is polyester.

16. An electrical device package as claimed in claim 1 in which the container is formed from metal.

17. An electrical device package as claimed in claim 16 in which the metal is aluminium.

18. An electrical device package as claimed in claim 1 in which the moulding material is epoxy material.

19. An electrical device package as claimed in claim 18 in which the epoxy material is a casting grade epoxy material.

* * * * *